United States Patent
Dasgupta

(10) Patent No.: US 6,298,466 B1
(45) Date of Patent: Oct. 2, 2001

(54) METHOD AND SYSTEM FOR SYNTHESIZING OPERATIONAL AMPLIFIERS FOR AMPLIFYING SYSTEMS WITH MINIMAL TOTAL HARMONIC DISTORTION

(75) Inventor: Uday Dasgupta, Singapore (SG)

(73) Assignee: Tritech Microelectronics, Ltd., Singapore (SG)

( * ) Notice: Subject to any disclaimer, the term of this patent is extended or adjusted under 35 U.S.C. 154(b) by 0 days.

(21) Appl. No.: 09/206,747

(22) Filed: Dec. 7, 1998

(51) Int. Cl.[7] .............................. G06F 17/50; H03F 3/45; H03G 3/10; H03G 3/18; H03G 3/30

(52) U.S. Cl. ................................. 716/1; 330/254; 330/278

(58) Field of Search .................................................... 716/1

(56) References Cited

U.S. PATENT DOCUMENTS

| | | | |
|---|---|---|---|
| 4,716,381 | 12/1987 | Campbell | 330/256 |
| 4,730,168 | * 3/1988 | Senderowicz et al. | 330/253 |
| 4,794,349 | * 12/1988 | Senderowicz et al. | 330/253 |
| 4,922,445 | 5/1990 | Mizoue et al. | 364/578 |
| 5,046,016 | 9/1991 | Krill et al. | 364/488 |
| 5,376,896 | 12/1994 | Graefe et al. | 330/149 |
| 5,402,357 | 3/1995 | Schaefer et al. | 364/490 |
| 5,410,273 | * 4/1995 | Brehmer et al. | 330/253 |
| 5,694,052 | 12/1997 | Sawai et al. | 324/769 |
| 5,714,906 | 2/1998 | Motamed et al. | 327/563 |
| 6,002,299 | * 12/1999 | Thomsen | 330/9 |
| 6,137,356 | * 10/2000 | Sakuragi | 330/86 |

OTHER PUBLICATIONS

S. Sakurai et al., Robust Design of Rail–to–Rail Cmos Operational Amplifiers Low Power Supply Voltage, IEEE Journal of Solid–State Circuits, pp. 146–156, Feb. 1996.*

R. Harjani et al., OASYS; A Framework for Analog Circuit Synthesis, IEEE Transactions on Computer Sided Design of Integrated Circuits and Systems, pp. 1247–1266, Dec. 1989.*

C.A. Makris et al., Improved Operational Amplifier Settling Behaviour Using Compensation Techniques, IEEE International Symposium on Circuits and Systems, pp. 617–620, May 1990.*

K. Young et al., Automatic Layout Generation of CMOS Operational Amplifiers, IEEE International Conference on Computer–Aided Design, pp. 548–551, Nov. 1988.*

T. Duisters et al., A 90–db THD Rail–to–Rail Input Opamp Using a New Local Pump in CMOS, IEEE Journal of Solid State Circuits, pp. 947–955, Jul. 1998.*

(List continued on next page.)

Primary Examiner—Matthew S. Smith
Assistant Examiner—A. M. Thompson
(74) Attorney, Agent, or Firm—George O. Saile; Stephen B. Ackerman; Billy Knowles

(57) ABSTRACT

A method and system for designing a two-stage operational amplifier having low total harmonic distortion. The method begins with estimating a gain level of a second stage of the operational amplifier. Then a transconductance of the second stage is calculated. A unity gain frequency level for the first stage is calculated and from that the one kilohertz gain level of the first stage. The gain level at one kilohertz is then calculated and from this, the unity gain frequency for the operational amplifier is then calculated. A value of the compensation capacitor for said operational amplifier is calculated followed by calculating a transconductance of a first stage of the operational amplifier. The overall D.C. gain level and the output resistance of the first stage of the operational amplifier is then determined. The transconductance of the first and second stages, the output resistance of the first stage with the load capacitance and resistance will be used to synthesize transistor sizes and bias current levels of the operational amplifier. The design is then simulated for stability and the method is repeated until stability is achieved.

22 Claims, 7 Drawing Sheets

OTHER PUBLICATIONS

S. Pernici et al., A CMOS Low Distortion Fully Differential Power Amplifier With Double Nested Miller Compensation, IEEE Journal of Solid–State Circuits, pp. 758–763, Jul. 1993.*

A. Fung et al., Knowledge–Based Analog Circuit Synthesis With Flexible Architecture, 1988 IEEE International Conference on Computer Design: VLSI in Compuers and Processors, pp. 48–51, Oct. 1988.*

* cited by examiner

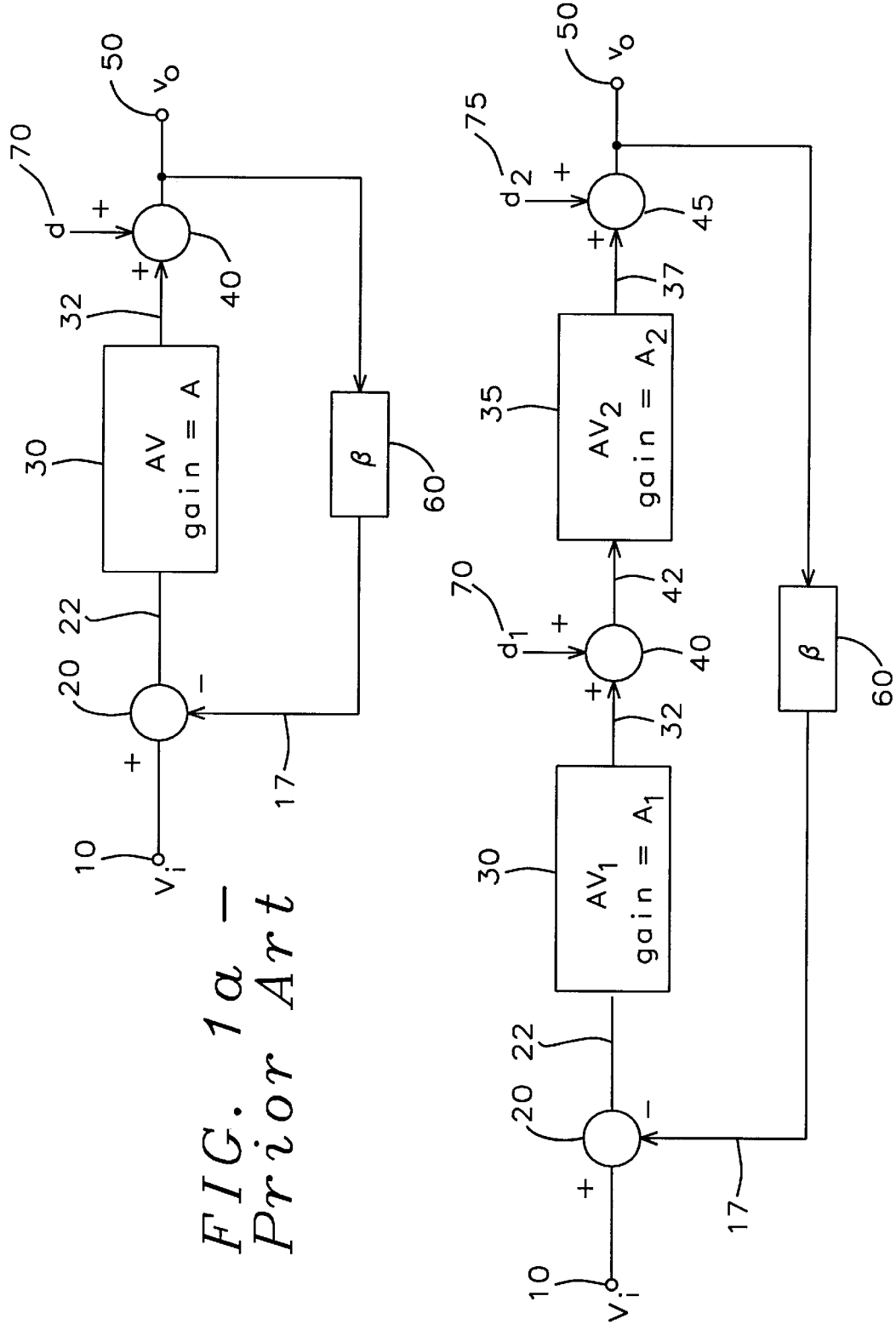
FIG. 1a – Prior Art
FIG. 1b – Prior Art

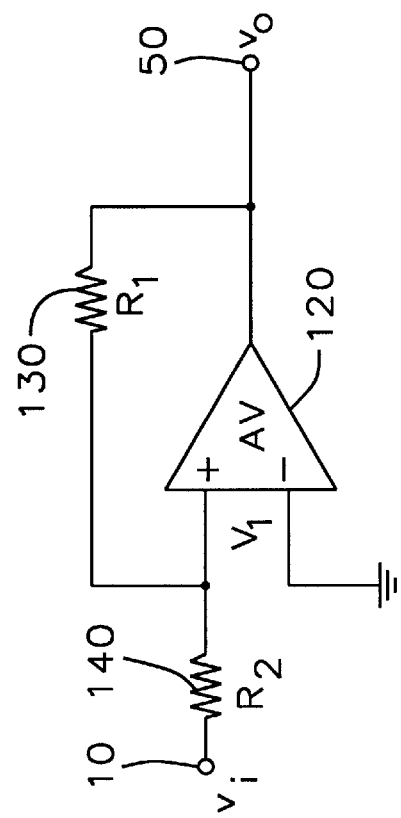
FIG. 2b -
Prior Art
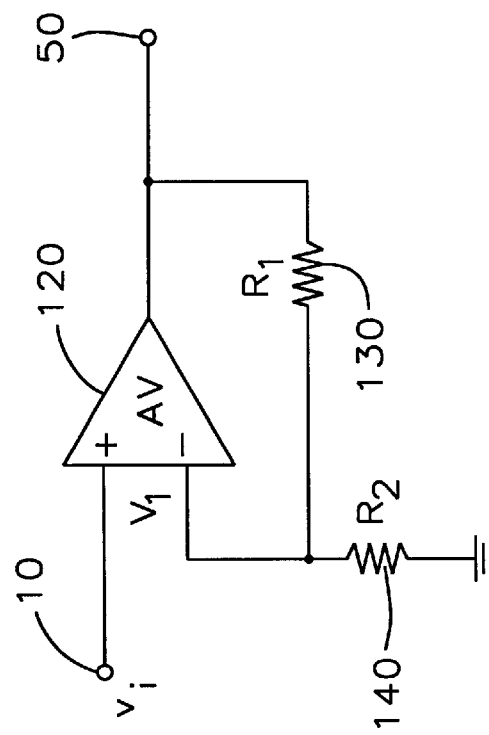
FIG. 2a -
Prior Art

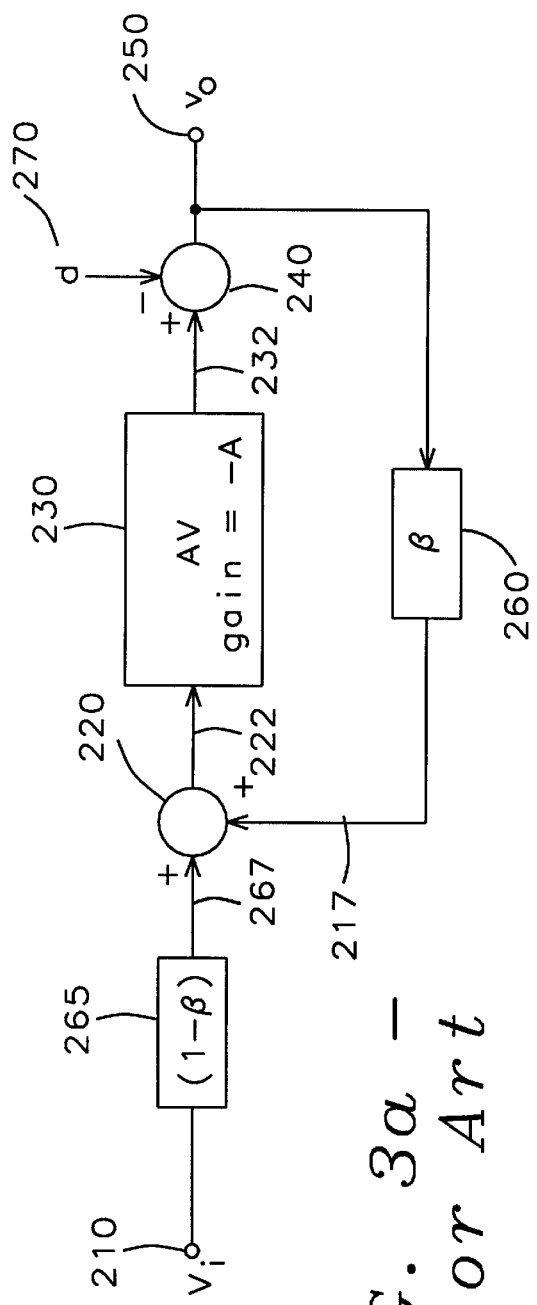
FIG. 3a - Prior Art
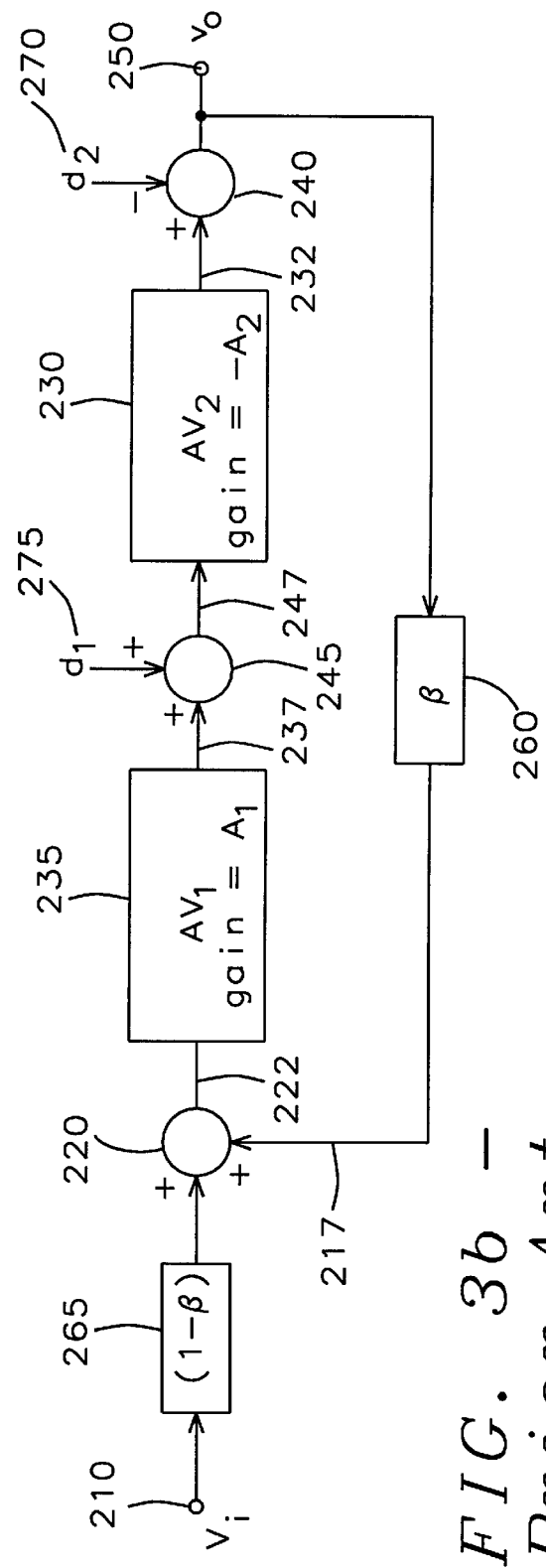
FIG. 3b - Prior Art

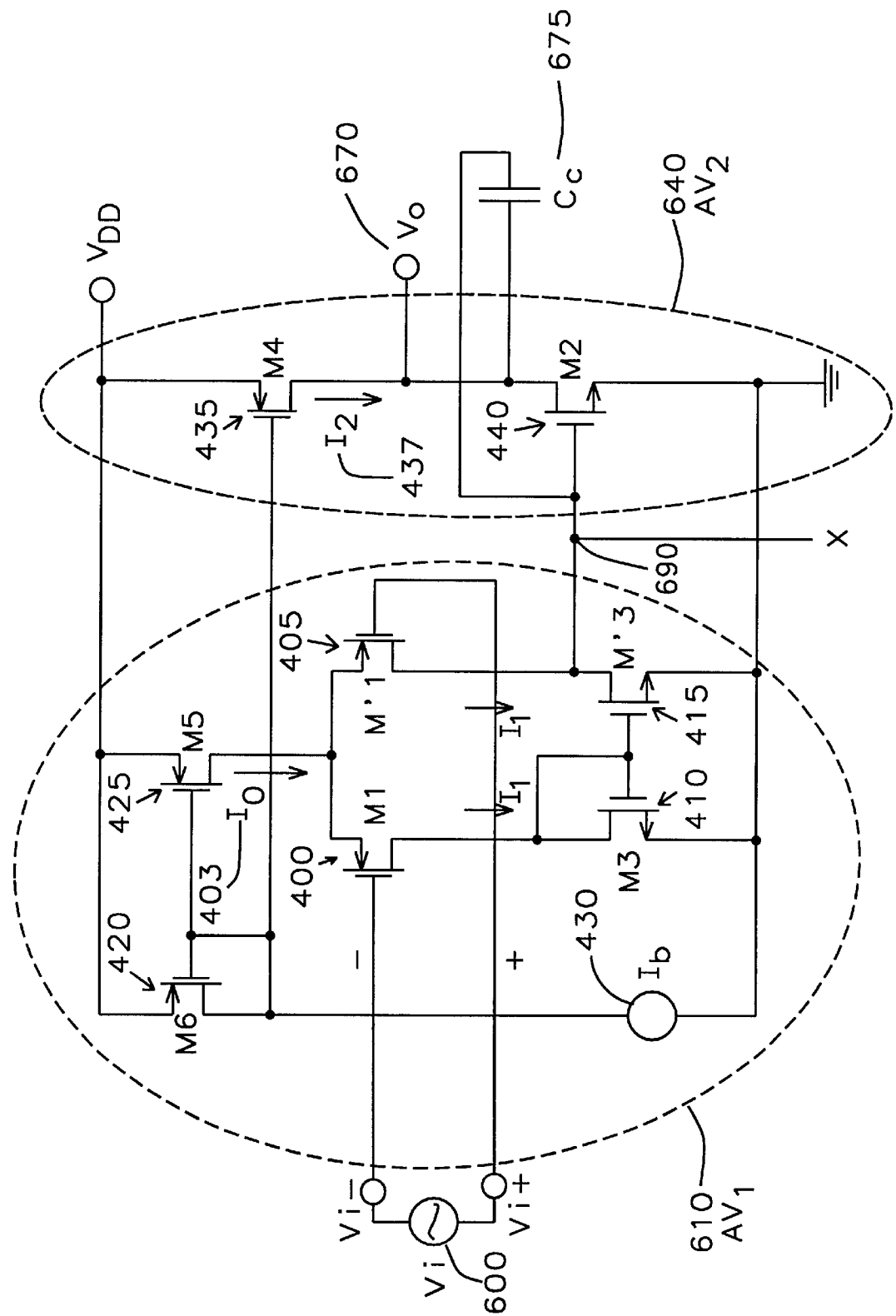
FIG. 4a – Prior Art

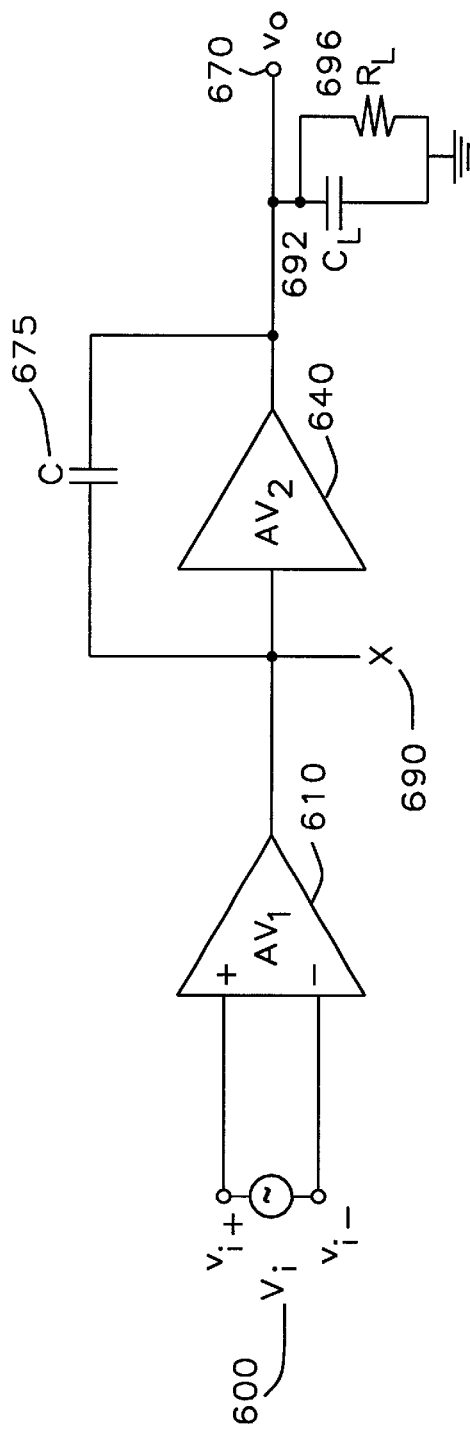
FIG. 4b – Prior Art
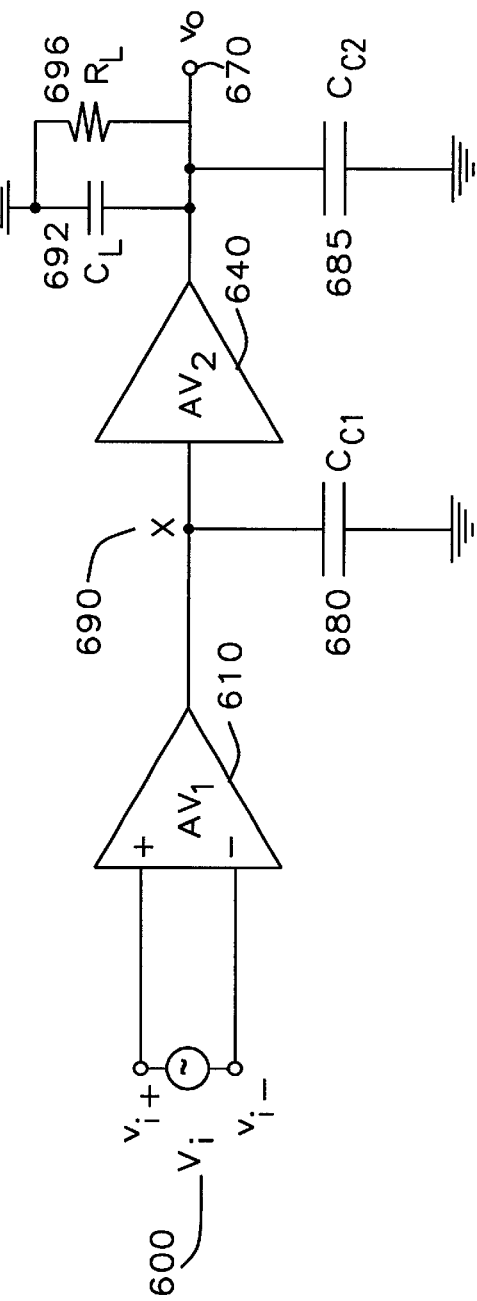
FIG. 4c – Prior Art

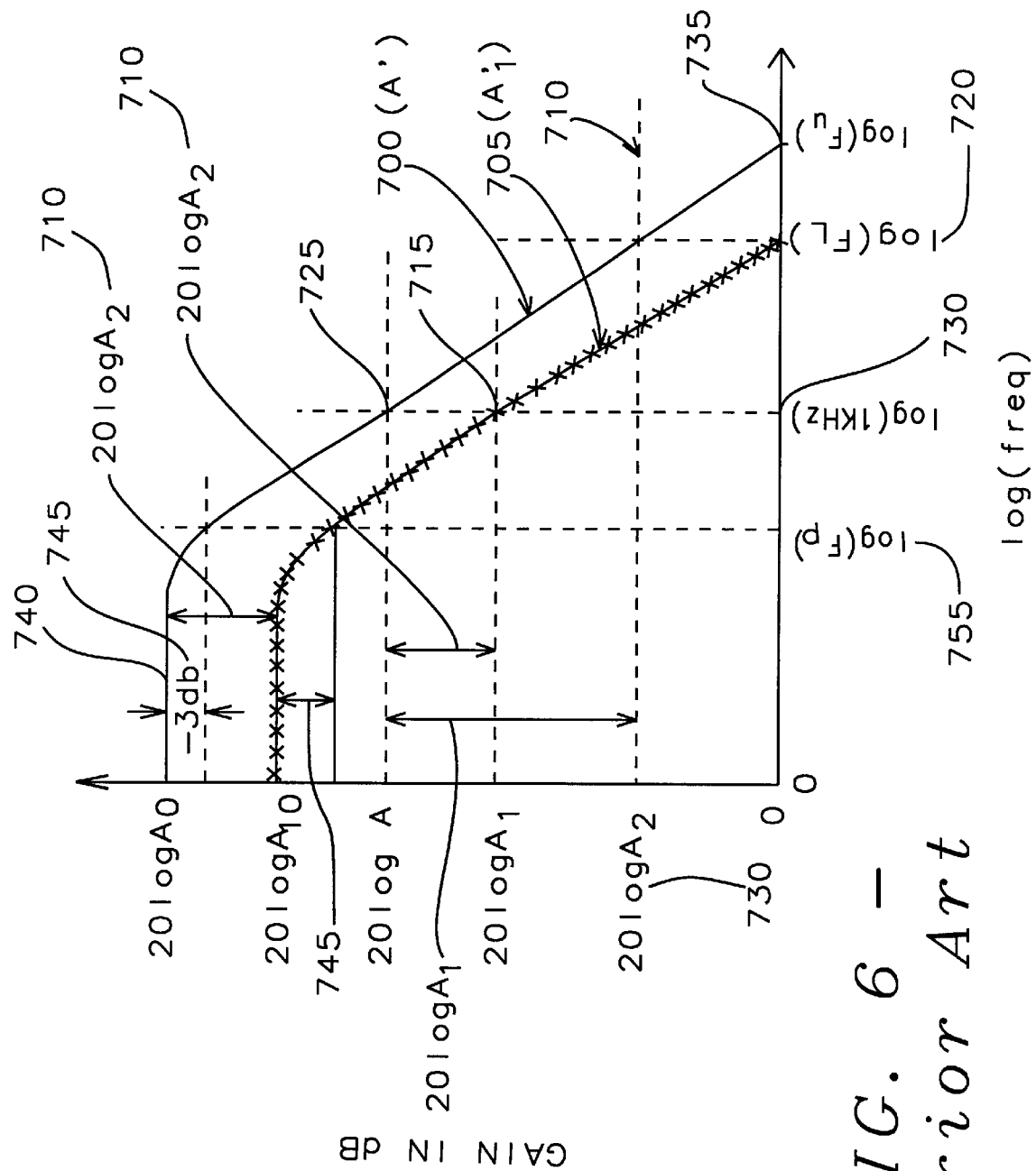
FIG. 6 — Prior Art

METHOD AND SYSTEM FOR SYNTHESIZING OPERATIONAL AMPLIFIERS FOR AMPLIFYING SYSTEMS WITH MINIMAL TOTAL HARMONIC DISTORTION

BACKGROUND OF THE INVENTION

1. Field of the Invention

This invention relates to methods and systems to establish a design methodology for operational amplifiers to be used in the design of amplifiers having low total harmonic distortion (THD). In particular this invention relates to methods and systems that will optimize the components such as transistors and compensation capacitors of operational amplifiers to minimize total harmonic distortion for inverting or non-inverting amplifiers designed using these methods and systems.

2. Description of Related Art

Methods and systems for synthesizing logic circuits are known in the art. For instance, U.S. Pat. No. 5,402,357 (Schaefer et al.) discloses a system and method for synthesizing logic circuits with timing constraints. In a computer aided design system, a net list specifies the integrated circuit's components and a set of interconnecting nodes. Also provided are a set of timing constraints for propagation of signals from specified input nodes to specified output nodes, and a set of signal delays associated with the circuit's components. The automatic circuit layout synthesis process begins by assigning an initial capacitance value to each node. Next, a routing difficulty value is computed; this value comprises a sum of routing difficulty values associated with each of the nodes in the integrated circuit. Capacitance values for the integrated circuit are then adjusted to reduce the computed routing difficulty. Finally, the net list and adjusted capacitance values are passed to a silicon compiler for automatic placement and routing of a circuit having capacitance values not exceeding the adjusted capacitance values.

Additionally, methods for simulating logic circuits are known in the art. An example of a logic simulation method is shown in U.S. Pat. No. 4,922,445 (Mizoue et al.). The logic circuit simulation method allow the simulating of a logic circuit that includes a plurality of logic blocks. After having simulated the whole simulation object logic circuit, the signal variation information of an arbitrary logic block is taken out from the simulation result. The simulation result that is taken out is to other logic blocks and a renewed simulation is executed for every logic block.

Computer aided design techniques have been developed for analog circuitry as is shown in U.S. Pat. No. 5,046,016 (Krill et al.). Krill et al. describes a method for the computer aided design for TE01 mode circular waveguides. The method will create designs for circular overmoded waveguide systems having optimal operating characteristics. The CAD method receives selected input waveguide operational, material, and structural parameters and computes the resulting waveguide operational characteristics, induding power losses for a given waveguide system configuration, including both straight and bent sections. Optimal designs for lined dielectric and sheathed-helix types of circular waveguide and waveguide bends have resulted for both S- and X-band operation.

Methods and systems for analysis and evaluation of semiconductor circuit performance characteristics are well known in the art and illustrated by U.S. Pat. No. 5,694,052 (Sawai et al.). A characteristic of a MOS transistor is represented using an equivalent model. The equivalent model shows a connection configuration made up of an electric current source that supplies an electric current and a resistor element that is connected in parallel with the electric current source. The electric current is given by the equation of $i = G_m * (V_{GS} - V_T)$ for $V_{GS} >= V_T$ where $G_m$ is a coefficient, $V_{GS}$ is a gate-to-source input voltage of said MOS transistor, and $V_T$ is a given threshold voltage. A plurality of operating zones of the MOS transistor are defined according to the drain, source, and gate terminal voltages of the MOS transistor and are assigned respective values of the coefficient $G_m$ and respective values of the resistor element's resistance. By such a representation, the circuit equation of a semiconductor circuit that is analyzed can be represented in the form of a linear time-invariant equation. Semiconductor circuit performance characteristics can be analyzed and evaluated at high accuracy and high speed.

U.S. Pat. No. 5,714,906 (Motamed et al.) discloses a low voltage constant transconductance input stage. The low voltage, constant transconductance input stage is achieved with relatively simple design methodology. The approach uses current-mode techniques and is based upon the processing of signal currents, rather than handling the bias currents of input stages. Such an approach becomes universal and independent of the input stage transistor types, whether FET or bipolar transistors. Further, the arrangement considerably simplifies the design procedure of low voltage operational amplifiers. MOS and bipolar operational amplifier input stages are described wherein almost constant gm is achieved which is independent of the common mode input voltage ranging from rail-to-rail.

U.S. Pat. No. 4,716,381 (Campbell) describes an operational amplifier suitable for inclusion in an integrated circuit device operating as a transceiver at a coaxial media interface to a network meeting IEEE 802.3 standards. To be included in an integrated circuit package, the operational amplifier must have low-power consumption and yet generate up to 80 ma of current onto the network. A design method achieves this goal producing an operational amplifier having three independently positioned, isolated, poles. A current generator and level shifter is employed with the operational amplifier that generates a current precisely proportional to a "collision" reference voltage. The current is compensated for changes in temperature and for variations in transistor gain (hFE). A very wide band level shifter matches the current generated to the requirements of the operational amplifier so that 10% to 90% changes in current generated by the op amp can occur in ½ to ¾ of a nanosecond, yet the level shifter does not consume much power. The current generator provides a single point of circuit element control for compensating for hFE variation in three transistors used within the current generator. The level shifter employs current-steering to produce the switched current that is exceptionally fast and low in asymmetry. The process used in integrated circuit manufacture permits control of the elements within the operational amplifier so that parameters can be held within 2% of the tolerances specified in the IEEE 802.3 standards without need of field "trimming".

U.S. Pat. No. 5,376,896 (Graefe et al.) discloses a circuit to reduce the level of noise and to reduce distortion of an input audio signal. The input audio signal is equally divided between a pair of Voltage Controlled Amplifiers (VCA). Each VCA receives an equal portion of the audio signal's current and has its gain controlled by a common control voltage. The outputs of the VCA's are summed together and are applied to an inverting input terminal of an operational amplifier. The gain of the VCA's is set at 6 dB and the gain of the op-amp is set at −6 dB. Since the operational amplifier sums the audio signals at 6 dB and sums noise and broadband signals at 3 dB, the signal to noise ratio in the output signal is increased and the noise level, the total harmonic distortion, the intermodulation distortion, and the DC feed through are all reduced in comparison to the input signal.

SUMMARY OF THE INVENTION

An object of this invention is to provide a method and system for designing an operational amplifier.

It is also an object of this invention to provide a method and system to create a two-stage operational amplifier to be used in signal amplifiers having low total harmonic distortion (THD). The low total harmonic distortion (THD) is the distortion as measured at a specific frequency usually one kilohertz for audio amplifiers.

To accomplish these and other objectives a method for designing a two-stage operational amplifier having minimum total harmonic distortion begins with estimating a gain level of a second stage of the operational amplifier. A good initial value for estimating the gain level of the second stage is assuming the gain level to be unity gain and reiterating the method for multiple iterations at which time an appropriate gain level is achieved. Next, a transconductance of the second stage of the operational amplifier is calculated by solving the equation:

$$gm_2 = \frac{A_2}{R_L}$$

where:

gm$_2$ is the transconductance of the second stage of the operational amplifier, A$_2$ is the gain level of the second stage of the operational amplifier, and R$_L$ is a load impedance connected to an output of the operational amplifier Next the unity gain frequency of a first stage of the operational amplifier is calculated according to the formula:

$$F_L = \frac{1}{2\pi R_L C_L}$$

where:

F$_L$ is the unity gain frequency of the first stage of the operational amplifier, R$_L$ is the load resistance of the two stage operational amplifier, and C$_L$ is the load capacitance of the two stage operational amplifier.

The gain at one kilohertz of the first stage of the operational amplifier is then calculated, as a function of the unity gain frequency of the first stage of the operational amplifier according to the formula:

$$A_1 = \frac{F_L}{1\text{kHz}}$$

where:

A$_1$ is the gain at one kilohertz of the first stage of the operational amplifier, and F$_L$ is the unity gain point of the first stage of the operational amplifier.

An overall one kilohertz gain level for the operational amplifier is then calculated according to the formula:

$$A = A_1 * A_2$$

or $$20 \log A = 20 \log A_1 + 20 \log A_2$$

where:

A is the overall one kilohertz gain level for the operational amplifier,

A$_1$ is the one kilohertz gain level for the first stage of the operational amplifier, and A$_2$ is the gain level for the second stage of the operational amplifier.

The next step of the method is calculating a unity gain frequency for the operational amplifier according to the formula:

$$F_U = A * 1 \text{ Khz}$$

where:

F$_U$ is the unity gain frequency, and

A is the one kilohertz gain level.

A value of a compensation capacitor for the operational amplifier is calculated according to the formula:

$$C_c = \frac{I_O}{SR}$$

where:

C$_c$ is the value of the compensation capacitor.

I$_O$ is the tail current of the differential pair of transistors of the first stage of the operational amplifier.

SR is the slew rate of the operational amplifier as specified as an input requirement.

Next a transconductance of a first stage of the operational amplifier; is calculated by solving the equation:

$$gm_1 = 2\pi * C_c F_U$$

where:

gm$_1$ is the transconductance of the first stage of the operational amplifier,

C$_c$ is the value of the compensation capacitor, and

F$_U$ is the unity gain frequency.

The overall D.C. gain level is determined from the inequality:

$$20 \log A_0 \geq 20 \log A + 3 \text{ db}$$

where:

A$_0$ is the overall D.C. gain level, and

A is the one kilohertz gain level.

The value of the overall D.C. gain level is not critical since the important performance criterion is the performance level at one kilohertz.

The next step of the method is determining an output resistance of the first stage of the operational amplifier by solving the equation:

$$R_{d1} = \frac{A_0}{gm_1 A_2}$$

where

A₀ is the overall D.C. gain level, gm₁ is the transconductance of the first stage of the operational amplifier, and A₂ is the gain level of the second stage of the operational amplifier.

Finally, the transistor sizes and bias current levels of the operational amplifier are synthesized according to standard techniques, given the transconductance of the first and second stages and the output resistance of the first stage. The operational amplifier is then simulated to determine if the an optimum design for total harmonic distortion (THD), power consumption, cell area, and stability has been achieved. If the operational amplifier design is not optimum, the method returns to estimating the gain level of the second stage of the operational amplifier. The gain level of the second stage of the operational amplifier is increased and the method is then iterated until the optimum design is achieved. The operational amplifier is then fabricated.

BRIEF DESCRIPTION OF THE DRAWINGS

FIGS. 1a and 1b are block diagrams illustrating a non-inverting operational amplifier as a dosed loop control system.

FIGS. 2a and 2b show a schematic of an operational amplifier configured as a non-inverting amplifier (FIG. 2a) and an inverting amplifier (FIG. 2b).

FIGS. 3a and 3b are block diagrams illustrating an inverting operational amplifier as closed loop control system.

FIGS. 4a, 4b, and 4c are schematic drawings of a two stage operational amplifier.

FIG. 6 is a plot of the open loop gain of an operational amplifier versus the frequency of an input signal to the operational amplifier.

DETAILED DESCRIPTION OF THE INVENTION

Figure 5:
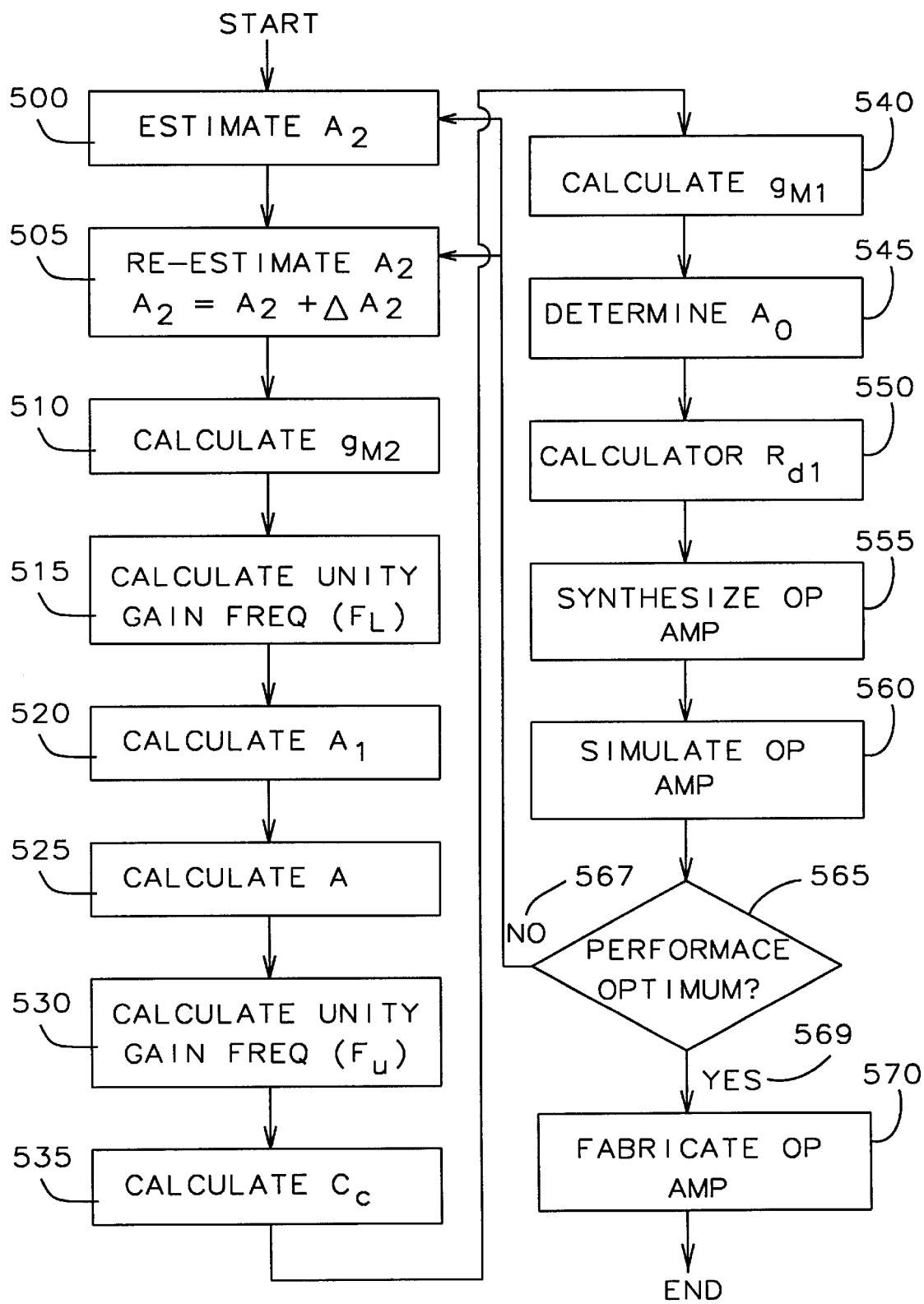
FIG. 5 is a flow chart of the method to design a two-stage operational amplifier having minimal total harmonic distortion of this invention.

The structure and design of operational amplifier circuits are well understood in the art. An abstract representation of a non-inverting amplifier as in FIG. 2a where the operational amplifier 120 is constructed of a single amplifying stage is shown in FIG. 1a. Input signal Vi 10 is an input to the subtractor 20. The output 22 of the subtractor 20 is the input of the gain block 30. The gain block 30 has an amplification factor or gain A. The signal at the output of the gain block Av 30 is:

$$X_{32} = A * X_{22}$$

Where:

X₃₂ is the signal present at the output 32 of the gain block 30.

X₂₂ is the signal present at the input 22 of the gain block 30.

The output 32 of the gain block Av 30 is the input of the summing node 40. The output of summing node 40 forms the output signal Vo 50. A sample of the output signal Vo 50 is the input to gain block 60. The output 17 of the gain block 60 is the input to the subtractor 20.

The gain block 60 will have an amplification factor or gain β. Thus, the signal at the output 17 of the gain block 60 is:

$$X_{17} = \beta V_o$$

where:

X₁₇ is the amplitude of the signal at the output 17 of the gain block 60.

The subtractor 20 subtracts the signal X₁₇ at the output 17 of the gain block 60 with the input signal Vi 10 to form the input 22 to the gain block 30.

The gain block 60 of FIG. 1a is represented by the resistors R₁ 130 and R₂ 140 of FIG. 2a. In the case of a non-inverting amplifier, as shown in FIG. 2a, the gain β of the gain block 60 is:

$$\beta = \frac{R_2}{R_1 + R_2}$$

Returning now to FIG. 1a, if the summing node 40 is ignored the output signal Vo 50 is shown as the formula:

$$V_o = \frac{AV_i}{1 + A\beta}.$$

If Aβ>>1 then 1+Aβ=Aβ and $$V_o \cong \frac{1}{\beta} V_i = \left(1 + \frac{R_1}{R_2}\right) V_i.$$

However, the operational amplifier 120 of FIG. 2a does not have a gain Av that is a constant function of the amplitude of the input signal Vi 10. Therefore, the output signal Vo 50 is not a linear function of the input signal Vi 10. This non-linearity is represented as a distortion component d 70 that is the input to the summing node 40.

Now the output signal Vo 50 is:

$$V_o = \frac{AV_i}{1 + A\beta} + \frac{1}{1 + A\beta} d.$$

If Aβ>>1 then 1+Aβ=Aβ and $$V_o \cong \frac{1}{\beta} V_i + \frac{1}{A\beta} d$$

$$= \left(1 + \frac{R_1}{R_2}\right) V_i + \frac{1}{A\beta} d.$$

To minimize distortion within the non-inverting operational amplifier of FIG. 1a, the product Aβ of the gain factor A of the gain block 30 and the gain factor β of the gain block 60 should be very large. The gain factor β of the gain block 60 as shown in FIG. 2a has a maximum value of 1. Therefore, the determining factor to reduce the effect of the distortion d 70 is the gain A of the gain block 30.

The total harmonic distortion (THO) of an audio amplifier is determined by applying a signal having a mid-range frequency such as 1 kHz at the input Vi 10 and measuring the power of the signal at the output Vo 50. The total harmonic distortion is defined as the square root of the ratio of the power of the signal at the output Vo 50 at all frequencies other than the mid-range frequency of 1 kHz to the power of the signal at the output Vo 50 at the mid-range frequency of 1 kHz. The total harmonic distortion is a measure of the fidelity of an audio amplifier. A low value of total harmonic distortion indicates that an amplifier has a high fidelity.

The above analysis is valid for operational amplifiers constructed from a single amplifying stage, but in reality, most operational amplifiers are with two amplifying stages. In such case, the non-inverting amplifier of FIG. 2*a* is better represented by FIG. 1*b*, in which, the gain block 35 and the summing node 45 are connected between the summing node 40 and the output Vo 50.

If the summing nodes 40 and 45 signals at the output are ignored, the output Vo 50 is:

$$V_o \cong \frac{1}{\beta} V_i$$

as determined previously.

When the distortion signals d1 70, which is the distortion component of the first amplifying stage, and d2 75, which is the distortion component for the second amplifying stage, are factored into the calculation, the signal at the output Vo 50 now is $$V_o = A_2[A_1(V_i - \beta V_o) + d_1] + d_2$$

$$= \frac{A_1 A_2}{1 + A_1 A_2 \beta} V_i + \frac{A_2}{1 + A_1 A_2 \beta} d_1 + \frac{1}{1 + A_1 A_2 \beta} d_2.$$

If $A_1 A_2 \beta \gg 1$ then $1 + A_1 A_2 \beta = A_1 A_2 \beta$ and $$V_o \cong \frac{1}{\beta} V_i + \frac{1}{A_1 \beta} d_1 + \frac{1}{A_1 A_2 \beta} d_2 \quad \text{Eq. 1}$$

$$= \left(1 + \frac{R_1}{R_2}\right) V_i + \frac{1}{A_1 \beta} d_1 + \frac{1}{A_1 A_2 \beta} d_2.$$

As can be seen, the distortion terms can be minimized in non-inverting amplifiers using two stage operational amplifiers by appropriate selection of the gains A1 and A2 of the gain blocks 30 and 35 respectively. That is, the gain of the first amplifying stage Av1 30 as well as the products of the gains of the first amplifying stage Av1 30 and the second amplifying stage Av2 35 of the operational amplifier needs to be high.

Refer now to FIG. 3*a* for a discussion of an inverting amplifier shown in FIG. 2*b*. FIG. 3*a* shows an abstract representation of the inverting amplifier of FIG. 2*b* When the operational amplifier 120 is constructed from a single amplifying stage. The input signal Vi 210 is the input to the gain block 265. The output 267 of the gain block 265 is the input of the summing node 220. The output 222 of the summing node 220 is the input of the gain block 230. The output of the gain block 230 is the input of the summing node 240. The output of the summing node 240 is the output signal Vo 250. The output signal Vo 250 is also the input of the gain block 260. The output 217 of the gain block 260 is the input to the summing node 220. Thus the signal at the output 222 of the summing node 220 will be $$V_{222} = V_i(1-\beta) + \beta V_o$$

where:

$$\beta = \frac{R_2}{R_1 + R_2}$$

R1 is the resistance of resistor R1 130 of FIG. 2*b*
R2 is the resistance of resistor R2 140 of FIG. 2*b*
Neglecting the summing node 240, the output voltage is:

$$V_o = -A(v_i(1-\beta) + \beta V_o)$$

$$V_o = -\left[\frac{(1-\beta)A}{1+A\beta}\right] V_i$$

If $A\beta \gg 1$ then $1 + A\beta = A\beta$ and $$V_o \cong -\left(\frac{1}{\beta} - 1\right) V_i = -\frac{R_1}{R_2} V_i$$

As described above, the distortion component d 270 must be added at the summing node 240 to form the output signal Vo 250. The output signal Vo 250 is now:

$$V_o = -A(v_i(1-\beta) + \beta V_o) - d$$

$$V_o = -\left[\left[\frac{(1-\beta)A}{1+A\beta}\right] V_i + \frac{1}{1+A\beta} d\right]$$

If $A\beta \gg 1$ then $1 + A\beta = A\beta$ and $$V_o \cong -\left(\frac{1}{\beta} - 1\right) V_i + \frac{1}{A\beta} d$$

$$= -\left[\frac{R_1}{R_2} V_i + \frac{1}{A\beta} d\right].$$

To minimize distortion within the inverting operational amplifier of FIG. 1*b* the product of the gain factor A of the gain block 230 and gain factor β of the gain block 260 must be maximized. As with the non-inverting operational amplifier of FIG. 1*a*, the gain factor β has a maximum value of 1. Therefore, the determining factor to reduce the effect of the distortion d 270 is the gain factor A of the gain block 230.

As described above, most operational amplifiers are realized with two gain stages. FIG. 3*b* is a more appropriate representation of the operational amplifier of FIG. 2*b*. The gain block 235 and the summing node 245 are placed between the summing node 220 and the gain block 230. If the summing nodes 240 and 245 are ignored, the output signal Vo 250 of the amplifier is:

$$V_o = -A_1 A_2((1-\beta) v_i + \beta V_o)$$

$$= -\left(\frac{A_1 A_2 - A_1 A_2 \beta}{1 + A_1 A_2 \beta}\right) V_i$$

If $A_1 A_2 \beta \gg 1$ then $1 + A_1 A_2 \beta = A_1 A_2 \beta$ and $$V_o \cong -\left(\frac{1}{\beta} - 1\right) V_i = -\frac{R_1}{R_2} V_i.$$

Now considering the non-linearity of the individual amplifying stages that are used to construct the two-stage operational amplifier as the distortion terms $d_1$ 275 and $d_2$ 270, the output signal $V_o$ 250 is now:

$$V_o = -A_2[A_1[(1-\beta)V_i + \beta V_o] + d_1] - d_2$$

$$= -\left[\left(\frac{A_1A_2 - A_1A_2\beta}{1 + A_1A_2\beta}\right)V_i + \left(\frac{A_2\beta}{1 + A_1A_2\beta}\right)d_1 + \left(\frac{1}{1 + A_1A_2\beta}\right)d_2\right]$$

If $A_1A_2\beta \gg 1$ then $1 + A_1A_2\beta = A_1A_2\beta$ and $$V_o \cong -\left[\left(\frac{1}{\beta} - 1\right)V_i + \frac{1}{A_1\beta}d_1 + \frac{1}{A_1A_2\beta}d_2\right] \quad \text{Eq. 2}$$

$$= -\left[\frac{R_1}{R_2}V_i + \frac{1}{A_1\beta}d_1 + \frac{1}{A_1A_2\beta}d_2\right].$$

As can be seen, the distortion terms can be minimized in the manner that is the same as for the non-inverting amplifier of FIG. 1b.

Refer to FIGS. 4a and 4b for an overview of the structure of a two-stage operational amplifier. The P-channel Metal Oxide Semiconductor (MOS) transistors M1 400 and M1' 405 are configured as a conventional differential pair of MOS transistors. The P-channel MOS transistors M1 400 and M1' 405 are designed to be equal or matched and therefore have equal device parameters such as transconductance $g_{m1}$. The gates of the P-channel MOS transistors M1 400 and M1' 405 form the differential inputs Vi− and Vi+. The input voltage source Vi 600 is connected between the input terminals Vi− and Vi+. The P-channel MOS transistors M6 420 and M5 425 are structured with the bias current source Ib 430 to form a constant current source for the differential pair of transistors M1 400 and M1' 405.

The N-channel MOS transistors M3 410 and M3' 415 are configured to form an active load for the differential pair of transistors M1 400 and M1' 405. The output resistance Rd1 of the first stage Av1 610 is the small signal output resistances of the P-channel transistors M1' 405 and the N-channel MOS transistor M3' 415 in parallel. The output resistance Rd1 and the transconductance $g_{m1}$ of the P-channel MOS transistors M1 400 and M1' 405 are functions of the geometry (channel width and length) and the doping profiles used to fabricate the MOS transistors M1 400, M1' 405, M5 425, M6 420, M3 410, and M3' 415, and the biasing current I6.

The second stage Av2 of the operational amplifier is an inverting CMOS amplifier. The amplifying transistor is the N-channel MOS transistor M2 440 and the P-channel MOS transistor M4 435 acts as an active load. The output X 690 of the first stage Av1 610 is connected to the gate of the N-channel MOS transistor M2 440. The drain of the N-channel MOS transistor M2 440 forms the output Vo 670 of the operational amplifier.

The P-channel MOS transistor M4 435 that forms the active load actually is a constant current source where the current I2 437 is proportional to the current in the current source Ib 430. The current I6 437 and the transconductance $g_{m2}$ of the N-channel MOS transistor M2 440 provide the, parameters necessary to determine the physical geometry of the N-channel MOS transistor M2 440. The current I2 is determined from the external resistive loading requirements.

The frequency compensation capacitor Cc 675 is connected between the drain and the gate of the N-channel MOS transistor M2 440. Further, the frequency compensation capacitor Cc 675 as shown in FIG. 4b can be decomposed by the application of the Miller theorem into the first and second Miller capacitors Cc1 680 and Cc2 685. The first Miller capacitor Cc1 680 has a value determined by the formula:

$$C_{c1} = A_2 * C_c$$

where:

A2 is the open loop gain of the second stage Av2 640.

Cc is the capacitance value of the compensation capacitor Cc 675.

The second Miller capacitor Cc2 685 has a value determined by the formula:

$$C_{c2} = \left(1 - \frac{1}{A_2}\right) * C_c$$

It should be noted that as the open loop gain A2 of the second stage Av2 640 becomes much, much greater than a unity gain level ($A_2 \gg 1$), the second Miller capacitor Cc2 685 approaches a value equal to the value of the frequency compensation capacitor Cc 675 and the first capacitor Cc1 680 is much, much greater than the second Miller capacitor Cc2 685. Therefore, the effect of second Miller capacitor Cc2 685 can be neglected for the frequency range of interest. Thus the open loop gain A2 of the second stage Av2 640 is independent of frequency, while the open loop gain A1 of the first stage Av1 610 is dependent on the frequency and consequently the overall open loop gain is frequency dependent, as is well known in the art.

Refer to FIG. 6 for a plot of the overall open loop gain A' 700, the open loop gain $A_1'$ 705 of the first stage Av1, and the open loop gain A2 710 of the second stage Av2 640. The D.C. values of the overall gain is designated A0 740 and the D.C. value of the open loop gain of the first stage Av1 705 is designated A10 750. The overall one kilohertz gain level is designated A 725 is the gain as measured at the one kilohertz frequency 730. The one kilohertz gain level of the first stage Av1 610 in designated A1 715 and is also measured at the one kilohertz frequency 730. Since the open loop gain A2 710 of the second stage Av2 640 is frequency independent, the plot of the overall open loop gain A' 700 is parallel and offset from the open loop gain $A_1'$ 705 of the first stage Av1 by the open loop gain A2 710 of the second stage Av2. The unity gain frequencies of the overall open loop gain A' 700 and the open loop gain $A_1'$ 705 of the first stage Av1 610 are designated Fu 735 and FL 720, respectively. The frequency designated Fp 755 is the dominant pole frequency of the operational amplifier.

The load capacitance CL 692 and the load resistance RL 696 connected between the output node Vo 670 and the ground reference point. In the design of an audio amplifier, the load capacitance CL 692 and the load resistance RL 696 are known.

Its apparent that the overall gain A 725 of a two stage operational amplifier is the product of the gain A1 715 of the first stage Av1 610 and the gain A2 710 of the second stage Av2 640, that is:

$$A = A_1 * A_2 \quad \text{Eq. 3}$$

or $$20 \log A = 20 \log A_1 + 20 \log A_2$$

From the Eq. 1 and Eq. 2, to minimize the total harmonic distortion, the gain A1 715 of the first stage Av1 610 and the gain A2 710 of the second stage Av2 640 need to be maximized.

Refer now to FIG. 5 to review the method for designing an operational amplifier of this invention, to FIG. 6 for a plot of the gain in dB versus the frequency of the operational amplifier, and to FIG. 4a for the schematic of the operational amplifier. The determination of the open loop gain A2 710 of the second stage Av2 640 is the first step 500 of the method for designing the operational amplifier. While the open loop gain A2 710 of the second stage Av2 640 is much, much greater than unity, it is convenient to begin the method by assuming the open loop gain A2 710 of the second stage Av2 640 is unity. The appropriate value of the open loop gain A2 710 of the second stage Av2 640 is determined upon a few iterations of the method. The transconductance gm2 of the N-channel MOS transistor M2 440 is calculated 510 by the formula:

$$gm_2 = \frac{A_2}{R_L} \qquad \text{Eq. 4}$$

where:

gm2 is the transconductance of the second stage Av2 640 of the operational amplifier, A2 is the gain level 710 of the second stage Av2 640 of the operational amplifier, and RL is the value of the load impedance RL 696 connected to an output of the operational amplifier.

For the operational amplifier to be stable under all closed loop conditions, the unity gain frequency FL 720 of the first stage Av1 610 must be calculated 515 according to the formula:

$$F_L = \frac{1}{2\pi R_L C_L} \qquad \text{Eq. 5}$$

where:

RL is the load resistance 696 of the operational amplifier.

CL is the load capacitance 692 of the operational amplifier. The gain A1 715 of the first stage Av1 610 is now set to its maximum value as calculated 520 by the formula:

$$A_1 = \frac{F_L}{1\text{KHz}} \qquad \text{Eq. 6}$$

The overall gain level A 725 at one kilohertz 730 can now be calculated 525 according to Eq. 3.

The unity gain frequency Fu 745 of the operational amplifier is now calculated 530 by the formula:

$$F_U = A * 1\text{ Khz} \qquad \text{Eq. 7}$$

where:

Fu is the unity gain frequency 735,

The compensation capacitor Cc 675 is now calculated 535 as a function of the tail current Io 403 of the input differential pair of transistors M1 400 and M1' 405 of the first stage Av1 610 and the slew rate SR.

$$C_c = \frac{I_O}{SR} \qquad \text{Eq. 8}$$

The tail current Io 403 of the input differential pair of transistors M1 400 and M1' 405 of the first stage Av1 610 is an open parameter and provided as an input to the design. The tail current Io 403 of the input differential pair of transistors M1 400 and M1' 405 of the first stage Av1 610 ranges from approximately 5 μa to approximately 50 μa. The slew rate SR is an input specified for the operational amplifier design requirements.

The transconductance gm1 of the P-channel MOS transistors M1 400 or M1' 405 of the differential pair of the first stage Av1 610 of FIG. 4a can now be calculated 540 by the formula:

$$gm_1 = 2\pi * C_c F_u \qquad \text{Eq. 9}$$

where:

gm1 is the transconductance of the first stage Av1 610 of the operational amplifier, Cc is the value of the compensation capacitor Cc 675, and RL is a load resistance RL 696. connected to an output of the operational amplifier.

Next the overall D.C. gain level A0 740 of the amplifier is determined 545 by satisfying the inequality:

$$20\log A_0 \geq 20\log A_{1khz} + 3 \text{ db}$$

where:

A0 is the overall D.C. gain level 740, and

A is the one kilohertz gain level 725.

Since the value of the overall D.C. gain level A0 715 is not critical the determination 545 of the overall D.C. gain level A0 715 is assigned the equality:

$$20\log A_0 = 20\log A + 3 \text{ db} \qquad \text{Eq. 10}$$

The output resistance Rd1 is the net resistance present at the output node X 690 in FIG. 4a. The output resistance Rd1 is mainly contributed by the small signal output resistances ro of the P-channel MOS transistor M1' 405 and the N-channel MOS transistor M3' 415 and from basic principles can be derived to be the formula:

$$R_{d1} = \frac{A_0}{gm_1 A_2} \qquad \text{Eq. 11}$$

where

A0 is the overall D.C. gain level 740, gm1 is the transconductance of the first stage Av1 610 of the operational amplifier, and A2 is the gain level 710 of the second stage Av2 640 of the operational amplifier.

Thus the next step of the method is to calculate 550 the output resistance Rd1 of the output X 690 of the first stage Av1 610 from Eq. 11.

Now that the transconductance gm1 of the first stage Av1 610, the transconductance gm2 of the second stage Av2 640, the output resistance Rd1 of the output X 690 of the first stage Av1 610, and the tail current Io 403 of the input differential pair of transistors M1 400 and M1' 406 of the first stage Av1 610 are known, the transistor sizes and the bias currents of the operational amplifier can be synthesized 555 using design techniques well understood in the art. Next, the operational amplifier is simulated 560 to determine the total harmonic distortion (THD) and stability using a circuit simulator The results of each iteration of the above steps are tested 565 for optimization. If the combination of closed loop stability, total harmonic distortion (THD), cell area, and power consumption are not optimum 567, the design is reiterated with the value of the gain level A2 710 increased 505. Once the combination of closed loop stability, total harmonic distortion (THD), cell area, and power consumption are optimum 569, the operational amplifier is fabricated 570.

It will be apparent to those skilled in the art that the above-described method can be implemented as computer program within a computer system to form an operational amplifier design system. The input parameters of the tail current Io, the slew rate SR of the operational amplifier, the load capacitance $C_L$ and the load resistance $R_L$ of the operational amplifier, and the criteria necessary to establish the initial estimate of the gain level $A_2$ of the second stage of the operational amplifier are received and retained in a receiving and storage device of the operational amplifier design system. A gain estimating device extracts the estimating criteria for the gain level $A_2$ of the second stage of the operational amplifier and estimates an initial value of the gain level $A_2$ of the second stage of the operational amplifier. A good initial estimate of the gain level $A_2$ of the second stage of the operational amplifier is a unity gain level, as stated above, the maximum of the gain level $A_2$ of the second stage of the operational amplifier is achieved after a few iterations of the operational amplifier design system.

A first transconductance calculating device is connected to the receiving and storage device and the gain estimating device to manipulate the gain level $A_2$ of the second stage of the operational amplifier and the load resistance $R_L$ of the operational amplifier to calculate the transconductance $gm_2$ of the second stage of the operational amplifier. The first transconductance calculating device with solve Eq. 4.

A first unity gain frequency calculator extracts the load resistance $R_L$ and the load capacitance $C_L$ values from the receiving and storage device to calculate the unity gain frequency $F_L$ of the first stage of the operational amplifier. The first unity gain frequency calculator then solves Eq. 5 to determine the unity gain frequency $F_L$ of the first stage of the operatonal amplifier.

A first stage gain calculator is connected to the first unity gain frequency calculator to determine the gain level $A_1$ of the first stage of the operational amplifier. The first stage gain calculator will solve Eq. 6 to determine the gain level $A_1$ of the first stage of the operational amplifier.

A one kilohertz gain calculator is connected to the gain estimating device and the first stage gain calculator to determine the one kilohertz gain level A. The one kilohertz gain calculator solves Eq. 3 to determine the one kilohertz gain level A.

A compensation capacitance calculator calculates the value of compensation capacitor $C_c$ as a function of the tail current Io and the slew rate SR of the operational amplifier. The compensation capacitance calculator calculates the value of the compensation capacitor $C_c$ by solving Eq. 8.

A second transconductance calculator calculates the transconductance $gm_1$ of the first stage. The second transconductance calculator receives the unity gain frequency $F_U$ from the unity gain frequency calculator and the value of the compensation capacitor $C_c$ for the compensation capacitance calculator to solve Eq. 5 to determine the transconductance of the $gm_1$ of the first stage of the operational amplifier.

The overall D.C. gain level determining device determines the overall D.C. gain level by satisfying the equality of Eq. 10.

An output resistance calculator is connected to the overall D.C. gain level determining device, the second transconductance calculator, and the first gain estimating device will determine the output resistance $R_{d1}$ of the output of the first stage of the operational amplifier. The output resistance calculator will solve Eq. 11 to calculate the output resistance $R_{d1}$.

A circuit synthesizer is connected to the first and second transconductance calculators, the output resistance calculator, and the receiving and storage device to receive the transconductance $gm_2$ of the second stage of the operational amplifier, the transconductance $gm_1$ of the first stage of the operational amplifier, the output resistance $R_{d1}$ of the first stage of the operational amplifier, the load resistance $R_L$ and the load capacitance $C_L$. Knowing the transconductance $gm_1$ of the first stage, and the transconductance of the second stage $gm_2$, output resistance $R_{d1}$, the circuit synthesizer will synthesize the device parameters and bias currents of the operational amplifier according to well known device design techniques. Once the device parameters and bias current values are determined, they are transferred to a circuit simulator such as SPICE, to determine the closed loop stability, the total harmonic distortion, the power consumption, and the cell size.

The device simulator is connected to a performance optimization evaluator. If the results of the circuit simulator indicate the performance of the operational amplifier is not optimum, the gain estimating device is instructed to choose a larger value of the gain level $A_2$ of the second stage of the operational amplifier and each unit is exercised again to determine the transconductance $gm_2$ of the second stage and $gm_1$ of the first stage of the operational amplifier and the output resistance $r_{d1}$ of the first stage. Once the operational amplifier design has been optimized, the design parameters are transferred to device fabricator for construction.

While this invention has been particularly shown and described with reference to the preferred embodiments thereof, it will be understood by those skilled in the art that various changes in form and details may be made without departing from the spirit and scope of the invention

The invention claimed is:

1. A method for fabricating an operational amplifier having minimum total harmonic distortion comprising the steps of:

estimating a gain level of a second stage of the operational amplifier;

calculating a transconductance of the second stage of the operational amplifier as a function of the gain level of the second stage and a load resistance of said operational amplifier;

calculating a unity gain frequency level for a first stage of said operational amplifier as a function of the load resistance and a load capacitance of said operational amplifier;

calculating a one kilohertz gain level of said first stage as a function of the unity gain frequency level of said first stage;

calculating an overall one kilohertz gain level as a function of the one kilohertz gain level of the first stage and the gain level of the second stage;

calculating a unity gain frequency for said operational amplifier as a function of the one kilohertz gain level;

calculating a value of a compensation capacitor for said operational amplifier as a function of a tail current of a differential pair of transistors within said first stage and a slew rate specified for said operational amplifier;

calculating a transconductance of a first stage of the operational amplifier as a function of the value of the compensation capacitor and the unity gain frequency of the operational amplifier;

determining an overall D.C. gain level as a function of the overall one kilohertz gain level;

determining an output resistance of the first stage of the operational amplifier as a function of the overall D.C. gain level, the transconductance of the first stage, the gain level of the second stage;

synthesizing transistor sizes and bias current levels of the operational amplifier given the transconductance of the first and second stages, and the output resistance of the first stage;

simulating said operational amplifier to determine if said operational amplifier is optimized to exhibit minimum total harmonic distortion;

if said operational amplifier is not optimized, repeating the above steps; and if said operational amplifier is optimized, fabricating said operational amplifier.

2. The method of claim 1 wherein estimating the gain level of the second stage comprises initialy setting said gain level to unity gain and then said method for fabricating the operational amplifier is iterated repetitively until an appropriate gain level is achieved.

3. The method of claim 1 wherein calculating the transconductance of the second stage of the operational amplifier is found by solving the formula:

$$gm_2 = \frac{A_2}{R_L}$$

where:
gm$_2$ is the transconductance of the second stage of the operational amplifier,
A$_2$ is the gain level of the second stage of the operational amplifier, and
R$_L$ is a load impedance connected to an output of said operational amplifier.

4. The method of claim 1 wherein calculating the unity gain frequency of said first stage is found by solving the formula:

$$F_L = \frac{1}{2\pi R_L C_L}$$

where:
F$_L$ is the unity gain frequency of the first stage of the operational amplifier,
R$_L$ is the load resistance of the two stage operational amplifier, and
C$_L$ is the load capacitance of the two stage operational amplifier.

5. The method of claim 1 wherein calculating the one kilohertz gain level of the first stage is found by solving the formula:

$$A_1 = \frac{F_L}{1\text{KHz}}$$

where:
A$_1$ is the gain at one kilohertz of the first stage of the operational amplifier, and
F$_L$ is the unity gain point of the first stage of the operational amplifier.

6. The method of claim 1 wherein calculating the overall one kilohertz gain level is solving the formula:

$$A = A_1 * A_2$$

where:
A is the overall one kilohertz gain level for the operational amplifier,
A$_1$ is the one kilohertz gain level for the first stage of the operational amplifier, and
A$_2$ is the gain level for the second stage of the operational amplifier.

7. The method of claim 1 wherein calculating the unity gain frequency is performed by solving the formula:

$$F_U = A * 1 \text{ Khz}$$

where:
F$_U$ is the unity gain frequency, and
A is the one kilohertz gain level.

8. The method of claim 1 wherein calculating the value of the compensation capacitor is solving the formula:

$$C_c = \frac{I_o}{SR}$$

where:
C$_c$ is the value of the compensation capacitor,
I$_o$ is the tail current of the differential pair of transistors of the first stage of the operational amplifier, and
SR is the slew rate of the operational amplifier as specified as an input requirement.

9. The method of claim 1 wherein calculating the transconductance of the first stage of the operational amplifier is performed by solving the formula:

$$gm_1 = 2\pi * C_c F_U$$

where:
gm$_1$ is the transconductance of the first stage of the operational amplifier,
C$_c$ is the value of the compensation capacitor, and
F$_U$ is the unity gain frequency.

10. The method of claim 1 wherein determining the overall D.C. gain level is performed by satisfying the inequality:

$$20 \log A_0 \geq 20 \log A + 3 \text{ db}$$

where:
A$_0$ is the overall D.C. gain level, and
A is the one kilohertz gain level.

11. The method of claim 1 wherein determining the output resistance of the first stage of the operational amplifier is performed by solving the formula:

$$R_{dI} = \frac{A_0}{gm_1 A_2}$$

where:
A$_0$ is the overall D.C. gain level,
gm$_1$ is the transconductance of the first stage of the operational amplifier, and
A$_2$ the gain level of the second stage of the operational amplifier.

12. An operational amplifier design system to design an operational amplifier having a first amplifier stage, a second amplifier stage and a minimum total harmonic distortion, comprising:

a receiving and storing means to receive and retain a tail current of a differential pair of transistors of the first amplifier stage, a slew rate of said operational amplifier, a load resistance, and a load capacitance of said operational amplifier;

a gain estimating means to estimate a gain level of the second amplifier stage of the operational amplifier;

a first transconductance calculating means coupled to the receiving and storing means and the gain estimating means to calculate a transconductance of the second amplifier stage of the operational amplifier as a function of the load resistance and the gain level of the second amplifier stage;

a unity gain frequency calculating means coupled to the receiving and storing means to calculate a unity gain frequency for the first amplifier stage as a function of the load resistance and the load capacitance;

a first gain calculating means connected to the unity gain frequency calculating means to calculate a one kilohertz gain level of the first amplifier stage as a function of the unity gain frequency of the first amplifier stage;

a second gain calculating means connected to the gain estimating means and the first gain calculating means to calculate the overall to calculate the one kilohertz gain level of the operational amplifier;

a unity gain frequency calculating means connected to the second gain calculating means to calculate a unity gain frequency for said operational amplifier as a function of the overall one kilohertz gain level;

a compensation capacitance calculating means connected to the receiving and storing means to calculate a value of a compensation capacitance for said operational amplifier as a function of said tail current and said slew rate;

a second transconductance calculating means connected to the compensation capacitance calculating means and the unity gain frequency calculating means to calculate a transconductance of the first amplifier stage of the operational amplifier as a function of the value of the compensation capacitance and the unity gain frequency;

an overall D.C. gain level determining means connected to second gain calculating means to determine an overall D.C. gain level as a function of the one kilohertz gain level;

an output resistance determining means connected to the overall D.C. gain level determining means, the gain estimating means, and the second transconductance calculating means to calculate an output resistance of the first amplifier stage of the operational amplifier as a function of the overall D.C. gain level, the gain level of the second amplifier stage of the operational amplifier, and the transconductance of the first amplifier stage of the operational amplifier;

a circuit synthesizing means connected to the receiving and storing means, the first transconductance calculating means, the second transconductance calculating means, the output resistance determining means, and the compensation capacitance calculating means to synthesize transistor sizes and bias currents for said operational amplifier;

a simulating means connected to said circuit synthesizing means to simulate the transistor sizes and bias currents of said operational amplifier to determine stability, total harmonic distortion (THD), cell area, and power consumption to insure an optimum design and connected to the gain estimating means to increase the estimate of the gain level of the second amplifier if the operational amplifier is not an optimized design, and a circuit fabricating means to fabricate said operational amplifier when said operational amplifier is an optimum design.

13. The design system of claim 12 wherein the first gain estimating means initially sets the gain level of the second amplifier stage to unity gain and a process of said design system iterates repetitively until an appropriate gain level for said second amplifier stage is achieved.

14. The design system of claim 12 wherein the first transconductance calculating means calculates the transconductance of the second amplifier stage of the operational amplifier by solving the formula:

$$gm_2 = \frac{A_2}{R_L}$$

where:

$gm_2$ is the transconductance of the second amplifier stage of the operational amplifier, $A_2$ is the gain level of the second amplifier stage of the operational amplifier, and $R_L$ is a load impedance connected to an output of said operational amplifier.

15. The design system of claim 12 wherein the unity gain frequency calculating means solves the formula:

$$F_L = \frac{1}{2\pi R_L C_L}$$

where:

$F_L$ is the unity gain frequency of the first amplifier stage of the operational amplifier, and $R_L$ is the load resistance of the two stage operational amplifier, and $C_L$ is the load capacitance of the two stage operational amplifier.

16. The design system of claim 12 wherein the first gain calculating means solves the formula:

$$A_1 = \frac{F_L}{1KHz}$$

where:

$A_1$ is the gain at one kilohertz of the first amplifier stage of the operational amplifier, and $F_L$ is the unity gain point of the first amplifier stage of the operational amplifier.

17. The design system of claim 12 wherein the second gain calculating means solves the formula:

$$A = A_1 * A_2$$

where:

A is the overall one kilohertz gain level for the operational amplifier,

A1 is the one kilohertz gain level for the first amplifier stage of the operational amplifier, and A2 is the gain level for the second amplifier stage of the operational amplifier.

18. The design system of claim 12 wherein the unity gain frequency calculating means calculates the unity gain frequency by solving the formula:

$$F_U = A * 1\ Khz$$

where:

F$_U$ is the unity gain frequency, and

A is the one kilohertz gain level.

19. The design system of claim 12 wherein the compensation capacitance calculating means solves the formula:

$$C_c = \frac{I_o}{SR}$$

where:

C$_c$ is the value of the compensation capacitor,

I$_o$ is the tail current of the differential pair of transistors of the first amplifier stage of the operational amplifier, and SR is the slew rate of the operational amplifier as specified as an input requirement.

20. The design system of claim 12 wherein the second transconductance calculating means calculates the transconductance of the first amplifier stage of the operational amplifier by solving the formula:

$$gm_1 = 2\pi * F_U$$

where:

gm$_1$ is the transconductance of the first amplifier stage of the operational amplifier, C$_c$ is the value of the compensation capacitor, and R$_L$ is a load impedance connected to an output of said operational amplifier.

21. The design system of claim 12 wherein the overall D.C. gain level determining means determines the overall D.C. gain by satisfying the inequality:

$$20\ \log A_0 = 20\ \log A + 3\ db$$

where:

A$_0$ is the overall D.C. gain level, and

A is the one kilohertz gain level.

22. The design system of claim 12 wherein the output resistance determining means determines the output resistance of the first amplifier stage of the operational amplifier by solving the formula:

$$R_{dI} = \frac{A_0}{gm_1 A_2}$$

where

A$_0$ is the overall D.C. gain level, gm$_1$ is the transconductance of the first amplifier stage of the operational amplifier, and A$_2$ is the gain level of the second amplifier stage of the operational amplifier.

\* \* \* \* \*